United States Patent
Lucchese

(10) Patent No.: US 9,791,481 B2
(45) Date of Patent: Oct. 17, 2017

(54) DIFFERENTIAL VOLTAGE MEASUREMENT

(75) Inventor: Alain Lucchese, Vigoulet Auzil (FR)

(73) Assignees: CONTINENTAL AUTOMOTIVE FRANCE, Toulouse (FR); CONTINENTAL AUTOMOTIVE GMBH, Hannover (DE)

(*) Notice: Subject to any disclaimer, the term of this patent is extended or adjusted under 35 U.S.C. 154(b) by 901 days.

(21) Appl. No.: 14/115,657

(22) PCT Filed: Apr. 17, 2012

(86) PCT No.: PCT/EP2012/001651
§ 371 (c)(1),
(2), (4) Date: Jan. 29, 2014

(87) PCT Pub. No.: WO2012/156016
PCT Pub. Date: Nov. 22, 2012

(65) Prior Publication Data
US 2014/0142879 A1 May 22, 2014

(30) Foreign Application Priority Data
May 13, 2011 (FR) .................. 11 01456

(51) Int. Cl.
*G01R 19/10* (2006.01)
*G01R 19/25* (2006.01)
(Continued)

(52) U.S. Cl.
CPC ......... *G01R 19/10* (2013.01); *G01R 19/2503* (2013.01); *G01R 19/0084* (2013.01); *G01R 31/007* (2013.01)

(58) Field of Classification Search
CPC ............... G01R 19/10; G01R 19/2503; G01R 19/0084; G01R 31/007
See application file for complete search history.

(56) References Cited

U.S. PATENT DOCUMENTS 7,656,164 B2  2/2010  Kawamura
8,237,428 B2  8/2012  Fuchs et al.
(Continued)

FOREIGN PATENT DOCUMENTS

CN    101646951    2/2010
CN    101776707    7/2010
(Continued)

OTHER PUBLICATIONS

International Search Report, dated Jun. 15, 2012, from corresponding PCT application.

*Primary Examiner* — Mohamed Charioui
*Assistant Examiner* — Jeremy Delozier
(74) *Attorney, Agent, or Firm* — Young & Thompson

(57) ABSTRACT

Measurement system and procedure suitable for measuring a voltage differential, the system comprising a measurement unit (1) having a first ground (10) as voltage reference and comprising a microcontroller (7) with an analog-digital converter (5), a sensor (2) having a second ground (20) as voltage reference, said second ground (20) being able to exhibit a potential difference with respect to the first ground (10), said measurement unit (1) having a first input (11) connected directly to the signal output (21) of the sensor (2), and a second input (12) connected directly to said second ground (20), the first and second inputs (11, 12) being linked to digital inputs (61, 62) of the microcontroller (7) through circuits for conditioning (31, 32, 41, 42) and analog-digital conversion (51, 52).

8 Claims, 1 Drawing Sheet

(51) Int. Cl.
    *G01R 19/00*          (2006.01)
    *G01R 31/00*          (2006.01)

(56) References Cited

U.S. PATENT DOCUMENTS

| | | | |
|---|---|---|---|
| 2005/0231212 A1* | 10/2005 | Moghissi | G01R 19/0084 324/606 |
| 2007/0024270 A1 | 2/2007 | Kawamura | |
| 2008/0265901 A1 | 10/2008 | Shimizu | |
| 2010/0176788 A1 | 7/2010 | Sun | |
| 2011/0248701 A1* | 10/2011 | Fuchs | G01R 19/0084 324/115 |

FOREIGN PATENT DOCUMENTS

| | | |
|---|---|---|
| DE | 10 2007 014329 A1 | 10/2008 |
| FR | 2 893 715 A1 | 5/2007 |
| JP | 2007024625 | 2/2007 |

\* cited by examiner

DIFFERENTIAL VOLTAGE MEASUREMENT

The present invention relates to systems and methods for acquiring signals delivered by a sensor.

More precisely, the invention relates to a measurement system suitable for measuring a voltage differential, said system comprising:
- a measurement unit having a first ground as voltage reference, comprising a microcontroller,
- a sensor having a second ground as voltage reference, said second ground being able to exhibit a potential difference with respect to the first ground, said sensor having a signal output,
- said measurement unit having a first input connected directly to the signal output of the sensor, and a second input connected directly to said second ground.

BACKGROUND OF THE INVENTION

It is known to place a differential amplifier for measuring the voltage difference existing between the first input and the second input, whose output is digitized and hooked up to a digital input of the microcontroller. However, this device does not make it possible to measure in a satisfactory manner the signal delivered by the sensor in the case where the second ground exhibits a negative potential with respect to the first ground. Moreover, a differential amplifier is generally expensive.

The aim of the present invention is in particular to remedy these drawbacks.

SUMMARY OF THE INVENTION

For this purpose, the invention proposes a measurement system suitable for measuring a voltage differential, said system comprising:
- a measurement unit having a first ground as voltage reference and comprising a microcontroller with an analog-digital converter,
- a sensor having a second ground as voltage reference, said second ground being able to exhibit a potential difference with respect to the first ground, said sensor having a voltage source with a signal output.

The measurement unit comprises a first input connected directly to the signal output of the sensor and a second input connected directly to said second ground.

The microcontroller comprises a first digital input linked to the first input through a first conditioning circuit (consisting of a first divider bridge and furnished with a first bias resistor) with analog-digital conversion, and a second digital input linked to the second input through a second conditioning circuit (consisting of a second divider bridge and furnished with a second bias resistor) with analog-digital conversion.

The measurement system is provided with means able to:
a) provide a biasing of the first input by means of a first bias resistor hooked up to a first bias potential,
b) provide a biasing of the second input by means of a first bias resistor hooked up to a first bias potential,
c) simultaneously acquire the voltages present on the first and second inputs of the measurement unit,
d) condition the voltage read on the first input into a first conditioned voltage, digitize this conditioned voltage into a first digital value provided on the first digital input of the microcontroller,
e) condition the voltage read on the second input into a second conditioned voltage, digitize this conditioned voltage into a second digital value provided on the second digital input of the microcontroller,
f) deduce therefrom the value of the voltage source,
g) eliminate from the measurement the potential difference between the first and second grounds.

The measurement system is noteworthy in that it comprises means for determining a digital image of the value of the voltage source obtained through the formula:

$$Ns = Nax \frac{(Rs + Rin + Rp)}{Rp} - Nay \frac{(Rin\_gnd + Rp\_gnd)}{Rp\_gnd} + Noff$$

in which:
Rs is the series resistance of the sensor,
Rin is the series resistance of the first conditioning circuit,
Rin_gnd is the series resistance of the second conditioning circuit,
Rp is the bias resistance of the first conditioning circuit,
Rp_gnd is the bias resistance of the second conditioning circuit,
Noff is a constant offset value,
and in which $$Noff = \frac{2^N}{Vref} \left[ \frac{Vp\_gnd * Kp\_gnd}{Ks\_gnd} - \frac{Kp * Vp}{Ks} \right]$$

By virtue of these provisions, a differential amplifier is no longer necessary and the reliability of the measurement is improved in the case where the second ground exhibits a negative potential with respect to the first ground.

In diverse embodiments of the invention, it is optionally possible to have recourse furthermore to one and/or to the other of the provisions described hereinafter.

The first input can be biased by a first bias resistor hooked up to a first bias potential, and the second input can be biased by a second bias resistor hooked up to a second bias potential. Thus, the biasing enables a possible negative voltage on the second input to be shifted toward the positive voltages.

The first and second bias voltages can each be derived from the reference voltage of the analog-digital converter of the measurement unit. Thus, the precision of the measurement is improved by suppressing possible differences of potentials between the biasing circuits and the analog-digital converter.

The first and second bias voltages can be identical to the reference voltage of the analog-digital converter of the measurement unit; thereby making it possible to further improve the measurement precision.

The first conditioning circuit can comprise a first foot resistor, and the second conditioning circuit can comprise a second foot resistor; by means of which the precision of the conditioners is improved.

The sensor can comprise a voltage source and a series resistor, the measurement unit being suitable for calculating a digital image of the voltage source, so that the voltage source can be precisely measured.

The invention is also aimed at a measurement procedure implemented in the measurement system in question.

Accordingly, the invention pertains to a voltage source measurement method implemented in a system comprising:
a measurement unit having a first ground as voltage reference and comprising a microcontroller, a sensor having a second ground as voltage reference, said second ground being able to exhibit a potential difference with respect to the first ground, said sensor having a voltage source with a signal output.

Said measurement unit comprises a first input connected directly to the signal output of the sensor, and a second input connected directly to said second ground.

Said microcontroller comprises a first digital input linked to the first input through a first conditioning circuit (consisting of a first divider bridge and furnished with a first bias resistor) with analog-digital conversion, and a second digital input linked to the second input through a second conditioning circuit (consisting of a second divider bridge and furnished with a second bias resistor) with analog-digital conversion.

The method comprises the following steps:
a) providing a biasing of the first input by means of a first bias resistor hooked up to a first bias potential,
b) providing a biasing of the second input by means of a first bias resistor hooked up to a first bias potential,
c) simultaneously acquiring the voltages present on the first and second inputs of the measurement unit,
d) conditioning the voltage read on the first input into a first conditioned voltage, digitizing this conditioned voltage into a first digital value provided on the first digital input of the microcontroller,
e) conditioning the voltage read on the second input into a second conditioned voltage, digitizing this conditioned voltage into a second digital value provided on the second digital input of the microcontroller,
f) deducing therefrom the value of the voltage source,
g) eliminating from the measurement the potential difference between the first and second grounds.

The method is noteworthy in that a digital image of the value of the voltage source is obtained through the formula:

$$Ns = Nax \frac{(Rs + Rin + Rp)}{Rp} - Nay \frac{(Rin\_gnd + Rp\_gnd)}{Rp\_gnd} + Noff$$

in which:
Rs is the series resistance of the sensor,
Rin is the series resistance of the first conditioning circuit,
Rin_gnd is the series resistance of the second conditioning circuit,
Rp is the bias resistance of the first conditioning circuit,
Rp_gnd is the bias resistance of the second conditioning circuit,
Noff is a constant offset value,
and in which $$Noff = \frac{2^N}{Vref} \left[ \frac{Vp\_gnd * Kp\_gnd}{Ks\_gnd} - \frac{Kp * Vp}{Ks} \right]$$

Advantageously, the first and second bias voltages are identical to the reference voltage of the analog-digital converter of the measurement unit $$Vp = Vp\_gnd = Vref$$

and in which $$Noff = 2^N \left[ \frac{Rin\_gnd}{Rp\_gnd} - \frac{Rin + Rs}{Rp} \right]$$

Then Noff is simpler and no longer depends on the bias voltages.

It is furthermore possible to carry out an initial calibration operation, comprising a measurement on at least one gauge sensor, making it possible to deduce an absolute correction coefficient B and a proportional correction coefficient A, and to calculate a corrected digital image Ns_corr of the digital image Ns of the voltage source according to the formula:

$$Ns\_Corr = A \times Ns + B.$$

Thus the precision of the measurement is improved as a function of the inherent characteristics of each measurement unit.

BRIEF DESCRIPTION OF THE DRAWINGS

Other aspects, aims and advantages of the invention will become apparent on reading the following description of an embodiment of the invention, given by way of nonlimiting example, with regard to the attached drawings in which.

DETAILED DESCRIPTION OF THE PREFERRED EMBODIMENTS

Figure 1:
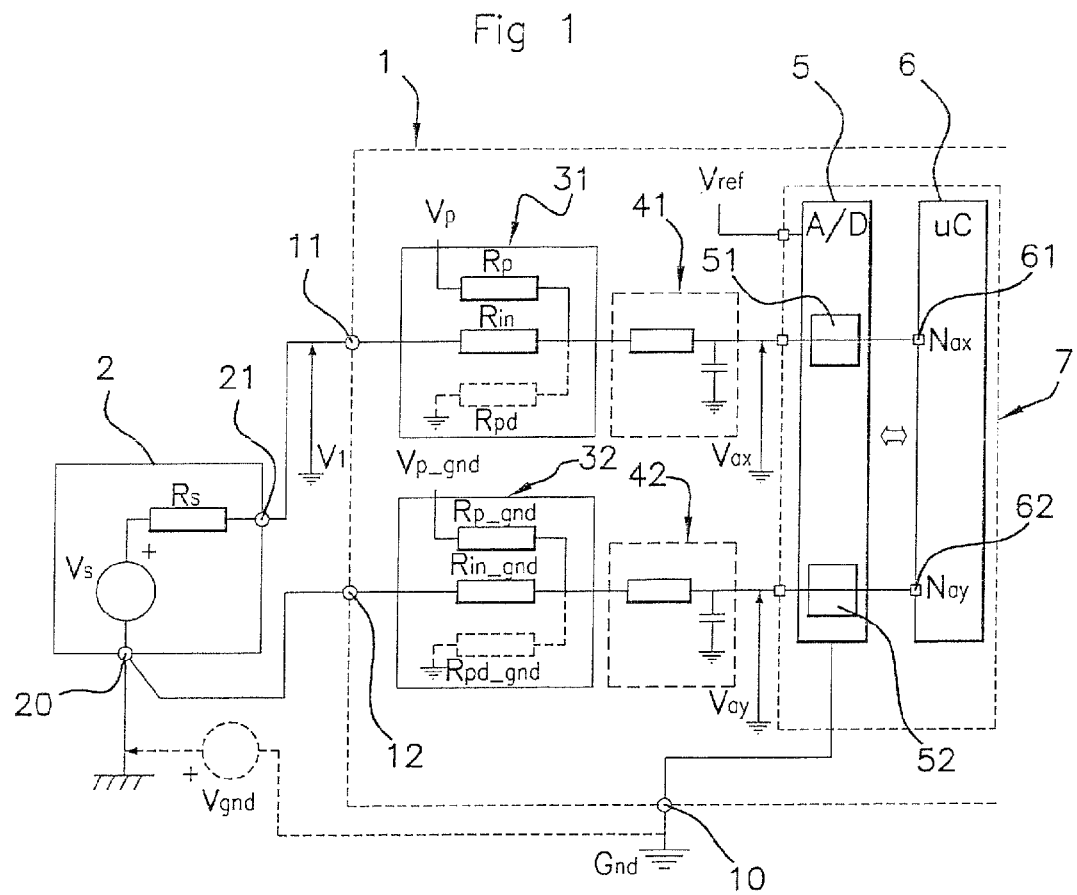
FIG. 1 presents a measurement system according to one embodiment of the invention.

FIG. 1 shows a measurement system comprising a measurement unit 1 having a first ground 10 as voltage reference, also designated by 'Gnd' in FIG. 1.

The measurement unit 1 is suitable for measuring the voltage delivered by a sensor 2 having a second ground 20 as voltage reference, said second ground 20 being able to exhibit a potential difference denoted 'Vgnd' with respect to the first ground 10. Said sensor 2 has a signal output 21 and comprises a voltage source Vs and a series resistor Rs.

The measurement unit 1 and the sensor 2 are for example installed aboard an automotive vehicle, the metallic shell of said vehicle being used as ground reference conductor. The potential difference 'Vgnd' can result from currents flowing in the conducting wires linking to the metallic shell of said vehicle, where these currents, in particular variable over time, engender voltage drops generating differentials of the ground voltage seen by the electrical equipment.

The measurement unit 1 comprises a microcontroller 7 with a logic unit 6 and an analog-digital converter 5, integrated into the microcontroller 7 in the example illustrated, but the analog-digital converter 5 could however be outside the microcontroller 7. The analog-digital converter 5 has a positive voltage reference Vref and a number of sampling bits N.

Moreover the measurement unit 1 comprises a first input 11 connected directly to the signal output 21 of the sensor 2, and a second input 12 connected directly to said second ground 20.

According to the invention, the first input 11 is linked to a first digital input 61 of the microcontroller 7 through a first conditioning circuit 31, 41 and then through a first channel 51 of the analog-digital converter 5.

The second input 12, for its part, is linked to a second digital input 62 of the microcontroller 7 through a second conditioning circuit 32, 42 and then through a second channel 52 of the analog-digital converter 5.

The first conditioning circuit 31 is biased by a first bias voltage Vp through a first bias resistor Rp. The first conditioning circuit 31 comprises an input resistor Rin, arranged in series on the first input circuit. These resistors form with the resistor Rs present in the sensor a divider bridge, the coefficients of which can be established in the following manner:

$$Ks=Rp/(Rs+Rin+Rp)$$

$$Kp=(Rs+Rin)/(Rs+Rin+Rp)$$

$$Ks+Kp=1$$

The first conditioning circuit 31 can optionally comprise a foot resistor Rpd, linked to the first ground.

The second conditioning circuit 32 is biased by a second bias voltage Vp_gnd through a second bias resistor Rp_gnd. The second conditioning circuit 32 comprises an input resistor Rin_gnd, arranged in series on the second input circuit. These resistors form a divider bridge, the coefficients of which can be established in the following manner:

$$Ks\_gnd=Rp\_gnd/(Rin\_gnd+Rp\_gnd)$$

$$Kp\_gnd=Rin\_gnd/(Rin\_gnd+Rp\_gnd)$$

$$Ks\_gnd+Kp\_gnd=1$$

The second conditioning circuit 32 can optionally comprise a foot resistor Rpd_gnd, linked to the first ground 10.

Furthermore, the first conditioning circuit 31 can be supplemented with a low-pass RC filter 41, known per se. In a similar manner, the second conditioning circuit 32 can be supplemented with a similar low-pass RC filter 42.

The voltage V1 read on the first input 11 passes through the first conditioning circuit 31 and subsidiarily the filtering circuit 41. At the output of these circuits, a resulting voltage Vax is linked to the input of the first channel 51 of the analog-digital converter 5. Likewise, the voltage Vgnd read on the second input 12 passes through the second conditioning circuit 32 and subsidiarily the filtering circuit 42. At the output of these circuits, a resulting voltage Vay is linked to the input of the second channel 52 of the analog-digital converter 5.

By neglecting the input current entering the analog-digital converter, it is possible to write the following equations:

$$Vax=Vgnd+Vs+Kp[Vp-Vs-Vgnd]$$

$$Vay=Vgnd+Kp\_gnd[Vp\_gnd-Vgnd]$$

Which may also be written:

$$Vax=KsVgnd+KsVs+KpVp$$

$$Vay=Ks\_gndVgnd+Kp\_gndVp\_gnd$$

By isolating the term Vgnd with a view to eliminating it and making Vs the subject, we obtain:

$$Vs=[Vax-KsVgnd-KpVp]/Ks$$

$$Vgnd=[Vay-Kp\_gndVp\_gnd]/Ks\_gnd$$

i.e.:

$$Vs = \frac{Vax}{Ks} - \frac{Vay}{Ks\_gnd} + \left[\frac{Kp\_gnd*Vp\_gnd}{Ks\_gnd} - \frac{Kp*Vp}{Ks}\right]$$

The last term is an offset voltage 'Voff' which can be written:

$$Voff = \frac{Kp\_gnd*Vp\_gnd}{Ks\_gnd} + \frac{Kp*Vp}{Ks}$$

Then:

$$Vs = \frac{Vax}{Ks} - \frac{Vay}{Ks\_gnd} + Voff$$

which is an expression for the voltage source of the sensor 2 as a function in voltages Vax, Vay entering the microcontroller 7.

By passing to the digital domain, and by putting:

$$Noff=(2N)Voff/Vref,$$

$$Nax=(2N)Vax/Vref, \text{ and}$$

$$Nay=(2N)Vay/Vref,$$

The digital image of the voltage source of the sensor 2 is obtained, as a function of the digitized values Nax, Nay respectively of Vax, Vay:

$$Ns = \frac{Nax}{Ks} - \frac{Nay}{Ks\_gnd} + Noff$$

that can also be written:

$$Ns = Nax\frac{(Rs+Rin+Rp)}{Rp} - Nay\frac{(Rin\_gnd+Rp\_gnd)}{Rp\_gnd} + Noff$$

With $$Noff = \frac{2^N}{Vref}\left[\frac{Vp\_gnd*Kp\_gnd}{Ks\_gnd} - \frac{Kp*Vp}{Ks}\right]$$

Noff is a constant value stored in the memory of the measurement unit 1.

It should be noted that in the case of the use of a microcontroller with no floating point operator, it is possible to call upon additional multipliers to avoid any division by a non-integer number.

According to another aspect of the invention, the first and second bias voltages (Vp,Vp_gnd) can each be derived from the reference voltage (Vref) of the analog-digital converter 5 of the measurement unit 1, so that drifts or shifts between the reference voltage Vref and the first and second bias voltages (Vp,Vp_gnd) are circumvented.

According to yet another aspect of the invention, the first and second bias voltages (Vp,Vp_gnd) can be identical to the reference voltage Vref of the analog-digital converter 5 of the measurement unit 1. Then the expression for Noff is simplified, so that shifts between the reference voltage Vref and the first and second bias voltages (Vp,Vp_gnd) are circumvented even better:

$$Noff = 2^N\left[\frac{Kp\_gnd}{Ks\_gnd} - \frac{Kp}{Ks}\right]$$

Or also written $$Noff = 2^N\left[\frac{Rin\_gnd}{Rp\_gnd} - \frac{Rs+Rin}{Rp}\right]$$

which then no longer depends on the bias voltages.

Figure 2:
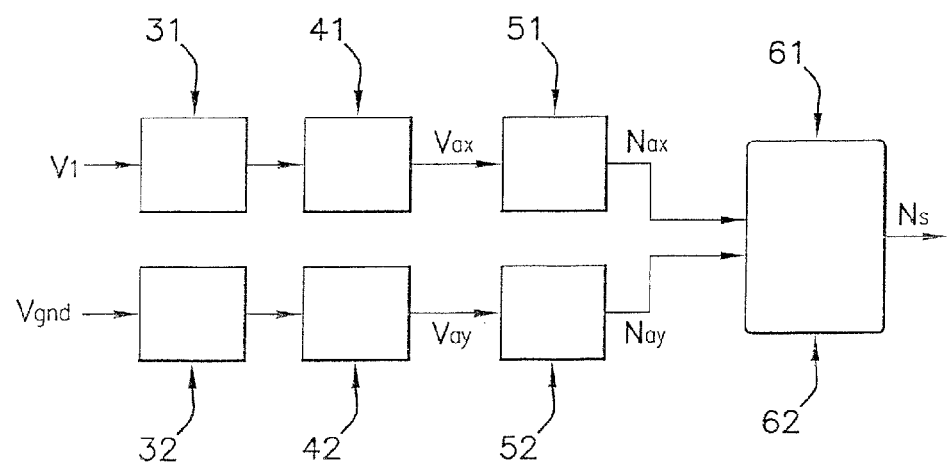
FIG. 2 is a diagram illustrating the method implemented in the system of FIG. 1.
In the various figures, the same references designate identical or similar elements.

The measurement method implemented in the measurement system described hereinabove (cf. FIG. 2) comprises the following steps:

providing a biasing of the first input 11, by means of the first bias resistor Rp and of the first bias voltage Vp, providing a biasing of the second input 12, by means of the second bias resistor Rp_gnd and of the second bias voltage Vp_gnd, simultaneously acquiring the voltages present on the first and second inputs 11, 12 of the measurement unit, this simultaneous aspect being significant since the ground differential Vgnd can evolve rapidly over time, conditioning the voltage read on the first input V1 into a first conditioned voltage Vax, digitizing this conditioned voltage into a first digital value Nax provided on the first digital input 61 of the microcontroller 7, conditioning the voltage read on the second input Vgnd into a second conditioned voltage Vay, digitizing this conditioned voltage into a second digital value Nay provided on the second digital input 62 of the microcontroller 7, deducing therefrom the value of the voltage source Vs, in particular of its digital image Ns, for example in accordance with the expressions given above for Ns and Noff.

By virtue of which the potential difference between the first ground 10 and the second ground 20 can be eliminated from the measurement, and this even in the case where Vgnd is negative.

According to yet another aspect of the invention, for a given measurement unit, an initial calibration operation can furthermore be carried out, comprising a measurement on one or more gauge sensors, making it possible to deduce an absolute correction coefficient B and a proportional correction coefficient A, making it possible to correct the digital image Ns of the voltage source (Vs) according to the formula Ns_corr=A*Ns+B. It is then possible to thus obtain an image Ns_corr corrected for the calibration coefficients which characterizes the measurement unit considered.

These correction coefficients A and B are identified, for each measurement unit, preferably at the end of its fabrication operation, according to a conventional process of calibration by means of one or more gauge sensors, and then the coefficients obtained A and B placed in memory in the nonvolatile memory of the measurement unit 1.

The invention claimed is:

1. A measurement system for measuring a voltage differential, said system comprising:

a measurement apparatus (1) having a first ground (10) as voltage reference, said measurement apparatus comprising a microcontroller (7) and an analog-digital converter (5); and a sensor (2) in electrical connection with the measurement apparatus, the sensor (2) having a second ground (20) as voltage reference, said second ground (20) configured to exhibit a potential difference with respect to the first ground (10), said sensor (2) having a voltage source (Vs) with a signal output (21), said measurement apparatus (1) comprising a first input (11) connected directly to the signal output (21) of the sensor (2), a first conditioning circuit (31, 41) connecting the first input to a first digital input (61) of the microcontroller (7), a second input (12) connected directly to said second ground (20), and a second conditioning circuit (32, 42) connecting the second input to a second digital input (62) of the microcontroller (7), each of the first conditioning circuit (31, 41) and the second conditioning circuit (32, 42) entering an analog-to-digital converter (51) before terminating at a respective one of the first and second digital input the first conditioning circuit (31, 41), comprised of a first divider bridge, and the second conditioning circuit (32, 42), comprised of a second divider bridge, wherein said first and second conditioning circuits (31, 41, 32, 42) comprise:

a first bias resistor (Rp) connected to a first bias potential (Vp) for biasing the first input (11), a second bias resistor (Rp_gnd) connected to a second bias potential (Vp_gnd) for biasing the second input (12), wherein a first input voltage (V1) read on the first input (11) is conditioned by the first conditioning circuit (31, 41) into a first conditioned voltage (Vax), and said first conditioned voltage (Vax) is then digitized by said analog-to-digital converter into a first digital value (Nax) provided to the first digital input (61) of the microcontroller (7), wherein a second input voltage (Vgnd) read on the second input (12) is conditioned by the second conditioning circuit (32, 42) into a second conditioned voltage (Vay), and said second conditioned voltage (Vay) is then digitized by said analog-to-digital converter into a second digital value (Nay) provided to the second digital input (62) of the microcontroller (7), wherein the microcontroller determines and outputs a digital value (Ns) corresponding to a value of the voltage source (Vs) by means of the first digital value (Nax) and the second digital value (Nay) input to the microcontroller, a potential difference between the first and second grounds (10,20) being not present in the output digital value (Ns) even where the second input (Vgnd) is negative, and wherein the microcontroller is configured to determine the digital value (Ns) corresponding to the value of the voltage source (Vs) by applying the first digital value (Nax) and the second digital value (Nay) to the formula:

$$Ns = Nax \frac{(Rs + Rin + Rp)}{Rp} - Nay \frac{(Rin\_gnd + Rp\_gnd)}{Rp\_gnd} + Noff$$

in which:

Rs is the series resistance of the sensor (2),

Rin is the series resistance of the first conditioning circuit (31),

Rin_gnd is the series resistance of the second conditioning circuit (32),

Rp is the bias resistance of the first conditioning circuit (31),

Rp_gnd is the bias resistance of the second conditioning circuit (32), and

Noff is a constant offset value, and in which Noff is determined by the microcontroller in accordance with the formula:

$$Noff = \frac{2^N}{Vref} \left[ \frac{Vp\_gnd * Kp\_gnd}{Ks\_gnd} - \frac{Kp * Vp}{Ks} \right]$$

in which:

$$Ks = \frac{Rp}{(Rs + Rin + Rp)},$$

$$Kp = \frac{(Rs + Rin)}{(Rs + Rin + Rp)}, \text{ and}$$

$Ks+kp=1$,

Vref being a positive voltage reference of the analog-digital converter (5) of the measurement unit (1),
Vp being a first bias voltage,
Vp gnd being a second bias voltage,
Kp and Ks being, for the first conditioning circuit (31), the coefficients of the divider bridge formed by the resistors Rp, Rin and the resistor Rs present in the sensor, and
Kp_gnd and Ks_gnd being, for the second conditioning circuit (32), the coefficients of the divider bridge formed by the resistors Rp_gnd, Rin_gnd.

2. The measurement system as claimed in claim 1, wherein the first and second bias voltages (Vp, Vp_gnd) are each derived from a reference voltage (Vref) of the analog-digital converter (5) of the measurement unit (1).

3. The measurement system as claimed in claim 2, wherein the first and second bias voltages (Vp, Vp_gnd) are identical to the reference voltage (Vref) of the analog-digital converter (5) of the measurement unit (1).

4. The measurement system as claimed in claim 3,
wherein the first conditioning circuit (31) comprises a first foot resistor (Rpd), and
wherein the second conditioning circuit (32) comprises a second foot resistor (Rpd_gnd).

5. A method for measuring a voltage source, comprising:
providing a measurement unit (1) that includes a microcontroller (7) and a first ground (10) as voltage reference, and a sensor (2) having a second ground (20) as voltage reference, said second ground (20) configured to exhibit a potential difference with respect to the first ground (10), said sensor (2) having a voltage source (Vs) with a signal output (21),
said measurement unit (1) comprising a first input (11) connected directly to the signal output (21) of the sensor (2), a first conditioning circuit (31, 41) connecting the first input to a first digital input (61) of the microcontroller (7), a second input (12) connected directly to said second ground (20), and a second conditioning circuit (32, 42) connecting the second input to a second digital input (62) of the microcontroller (7), each of the first conditioning circuit (31, 41) and the second conditioning circuit (32, 42) entering an analog-to-digital converter (51) before terminating at a respective one of the first and second digital input
the first conditioning circuit (31, 41), comprised of a first divider bridge, and the second conditioning circuit (32, 42), comprised of a second divider bridge;
biasing the first input (11) by means of a first bias resistor (Rp) connected to a first bias potential (Vp);
biasing the second input (12) by means of a second bias resistor (Rp_gnd) connected to a first bias potential (Vp_gnd);
simultaneously acquiring voltages present on the first and second inputs of the measurement unit (1) as a first input voltage (V1) and a second input voltage (Vgnd);
conditioning the acquired first input voltage (V1) into a first conditioned voltage (Vax) by way of the first conditioning circuit (31, 41), and digitizing said first conditioned voltage (Vax) into a first digital value (Nax) by way of said analog-to-digital converter, the first digital value (Nax) being provided to the first digital input (61) of the microcontroller (7);
conditioning the acquired second input voltage (Vgnd) on the second input (12) into a second conditioned voltage (Vay) by way of the second conditioning circuit (32, 42), and digitizing said second conditioned voltage (Vay) into a second digital value (Nay) by way of said analog-to-digital converter, the second digital value (Nay) being provided to the second digital input (62) of the microcontroller (7); and
determining, at the microcontroller, a digital value (Ns) corresponding to the value of the voltage source (Vs) by means of the first digital value (Nax) and the second digital value (Nay) input to the microcontroller, a potential difference between the first and second grounds (10,20) being not present in the output digital value (Ns) even where the second input (Vgnd) is negative,
wherein the microcontroller determines the digital value (Ns) corresponding to the voltage source (Vs) by the applying the first digital value (Nax) and the second digital value (Nay) to the formula:

$$Ns = Nax \frac{(Rs + Rin + Rp)}{Rp} - Nay \frac{(Rin\_gnd + Rp\_gnd)}{Rp\_gnd} + Noff$$

wherein:
Rs is the series resistance of the sensor (2),
Rin is the series resistance of the first conditioning circuit (31),
Rin_gnd is the series resistance of the second conditioning circuit (32),
Rp is the bias resistance of the first conditioning circuit (31),
Rp_gnd is the bias resistance of the second conditioning circuit (32), and
Noff is a constant offset value,
and in which the microcontroller determines Noff by calculating the formula:

$$Noff = \frac{2^N}{Vref} \left[ \frac{Vp\_gnd * Kp\_gnd}{Ks\_gnd} - \frac{Kp * Vp}{Ks} \right]$$

in which:

$$Ks = \frac{Rp}{(Rs + Rin + Rp)},$$

$$Kp = \frac{(Rs + Rin)}{(Rs + Rin + Rp)}, \text{ and}$$

$Ks+kp=1$,

Vref being a positive voltage reference of the analog-digital converter (5) of the measurement unit (1),
Vp being a first bias voltage,
Vp_gnd being a second bias voltage, Kp and Ks being, for the first conditioning circuit (31), the coefficients of the divider bridge formed by the resistors Rp, Rin and the resistor Rs present in the sensor, and Kp_gnd and Ks_gnd being, for the second conditioning circuit (32), the coefficients of the divider bridge formed by the resistors Rp_gnd, Rin_gnd.

6. The measurement method as claimed in claim 5, wherein the first and second bias voltages (Vp,Vp_gnd) are identical to the reference voltage (Vref) of the analog-digital converter (5) of the measurement unit (1) such that $$Vp=Vp\_gnd=V\mathrm{ref}$$

and in which $$Noff = 2^N \left[ \frac{Rin\_gnd}{Rp\_gnd} - \frac{Rs + Rin}{Rp} \right].$$

7. The measurement method as claimed in claim 5, wherein, the microcontroller of the measurement unit carries out an initial calibration operation, said initial calibration operation comprising:

carrying out a measurement on at least one gauge sensor, and determining therefrom an absolute correction coefficient and a proportional correction coefficient; and calculating a corrected digital image (Ns_corr) from the digital value (Ns) corresponding to the value of the voltage source (Vs) according to the formula:

$$Ns\_\mathrm{corr}=A \times Ns+B.$$

8. The measurement method as claimed in claim 6, wherein, the microcontroller of the measurement unit carries out an initial calibration operation, said initial calibration operation comprising:

carrying out a measurement on at least one gauge sensor, and determining therefrom an absolute correction coefficient and a proportional correction coefficient; and calculating a corrected digital image (Ns_corr) from the digital value (Ns) corresponding to the value of the voltage source (Vs) according to the formula:

$$Ns\_\mathrm{corr}=A \times Ns+B.$$

* * * * *